United States Patent
Tsai

(10) Patent No.: US 10,158,028 B2
(45) Date of Patent: Dec. 18, 2018

(54) SEMICONDUCTOR DEVICE AND METHOD OF MANUFACTURING THE SAME

(71) Applicant: MACRONIX International Co., Ltd., Hsinchu (TW)

(72) Inventor: Ying-Chieh Tsai, Hsinchu (TW)

(73) Assignee: MACROIX International Co., Ltd., Hsinchu (TW)

( * ) Notice: Subject to any disclaimer, the term of this patent is extended or adjusted under 35 U.S.C. 154(b) by 7 days.

(21) Appl. No.: 15/440,918

(22) Filed: Feb. 23, 2017

(65) Prior Publication Data
US 2018/0240913 A1    Aug. 23, 2018

(51) Int. Cl.
- H01L 29/66 (2006.01)
- H01L 29/808 (2006.01)
- H01L 29/06 (2006.01)
- H01L 29/10 (2006.01)
- H01L 29/40 (2006.01)
- H01L 21/266 (2006.01)
- H01L 21/324 (2006.01)
- H01L 21/225 (2006.01)

(52) U.S. Cl.
CPC ........ H01L 29/808 (2013.01); H01L 21/2253 (2013.01); H01L 21/266 (2013.01); H01L 21/324 (2013.01); H01L 29/0634 (2013.01); H01L 29/0696 (2013.01); H01L 29/1095 (2013.01); H01L 29/402 (2013.01); H01L 29/408 (2013.01); H01L 29/66901 (2013.01)

(58) Field of Classification Search
None
See application file for complete search history.

(56) References Cited

U.S. PATENT DOCUMENTS

| | | | |
|---|---|---|---|
| 5,420,062 A * | 5/1995 | Inada | H01L 21/823892 257/E21.644 |
| 8,785,988 B1 | 7/2014 | Chan et al. | |
| 9,048,732 B2 | 6/2015 | Lee et al. | |
| 9,076,880 B2 | 7/2015 | Knaipp et al. | |
| 9,299,857 B2 | 3/2016 | Chan et al. | |
| 2015/0048384 A1* | 2/2015 | Tanaka | H01L 29/47 257/77 |
| 2015/0179631 A1* | 6/2015 | Tsai | H01L 27/0623 257/140 |
| 2015/0325694 A1 | 11/2015 | Chan | |
| 2015/0333158 A1* | 11/2015 | Tsuchiko | H01L 29/1066 438/188 |

* cited by examiner

Primary Examiner — Calvin Choi
(74) Attorney, Agent, or Firm — J.C. Patents

(57) ABSTRACT

Provided is a semiconductor device including a substrate having a first conductivity type, a first well having a second conductivity type, a first doped region having the first conductivity type, a second well having the second conductivity type, at least one second doped region having the first conductivity type, at least one third doped region having the second conductivity type, and a fourth doped region having the second conductivity type. The first well is located in the substrate. The first doped region is located in the first well. The second well is located in the first well. The second doped region is located in the first doped region. The third doped region is located in the first well at a first side of the first doped region. The fourth doped region is located in the first well at a second side of the first doped region.

18 Claims, 5 Drawing Sheets

SEMICONDUCTOR DEVICE AND METHOD OF MANUFACTURING THE SAME

BACKGROUND OF THE INVENTION

Field of the Invention

The invention relates to an integrated circuit and a method of manufacturing the same, and particularly relates to a semiconductor device and a method of manufacturing the same.

Description of Related Art

High-voltage semiconductor devices are widely used in high-voltage AC-DC converters, LED drivers, and other fields. With the rise of environmental awareness, the high-voltage semiconductor devices having high conversion efficiency and low standby power consumption get more attention. Thus, a high-voltage start-up circuit (HV start-up circuit) and a pulse width modulation (PWM) circuit are usually integrated in a single chip to achieve the effect of energy saving.

In the prior art, a power resistor is usually used as the high-voltage start-up circuit. However, energy consumption is still continued after the power resistor starts up the pulse width circuit, such that the energy consumption is increased, which is not suitable for green products. In recent years, a high-voltage junction field-effect transistor (HV JFET) or a depletion mode double-diffused metal oxide semiconductor (depletion mode DMOS) is used as the high-voltage start-up circuit. The high-voltage junction field-effect transistor is turned off after starting up the pulse width circuit, so as to reduce the energy consumption. However, to withstand the voltage of up to several hundred volts, the size of the high-voltage junction field-effect transistor is larger, which limits the design flexibility of saturation current of the high-voltage junction field-effect transistor. Therefore, how to provide a high-voltage junction field-effect transistor, which can provide an adjustable and wide saturation current to meet different circuit needs without changing any of process conditions, is an important issue.

SUMMARY OF THE INVENTION

The invention provides a semiconductor device and a method of manufacturing the same, which can provide an adjustable and wide saturation current to meet different circuit needs in the case where the size and breakdown voltage of the semiconductor device are maintained.

The invention provides a semiconductor device and a method of manufacturing the same, which can change a pinch-off voltage in the case without changing any of processes and adding additional masks.

The invention provides a semiconductor device including a substrate having a first conductivity type, a first well having a second conductivity type, a first doped region having the first conductivity type, a second well having the second conductivity type, at least one second doped region having the first conductivity type, at least one third doped region having the second conductivity type, and a fourth doped region having the second conductivity type. The first well is located in the substrate. The first doped region is located in the first well. The second well is located in the first well and between the first doped region and the substrate. The at least one second doped region is located in the first doped region. The at least one third doped region is located in the first well at a first side of the first doped region. The fourth doped region is located in the first well at a second side of the first doped region.

According to an embodiment of the invention, the at least one second doped region is a gate. The at least one third doped region is a source. The fourth doped region is a drain. The gate and the source surround the drain.

According to an embodiment of the invention, the semiconductor device further includes at least one channel located in the first well and the second well below the first doped region and electrically connected to the source and the drain.

According to an embodiment of the invention, the at least one second doped region includes a plurality of gates. The at least one third doped region includes a plurality of sources. The fourth doped region is a drain. The gates respectively correspond to the sources and surround the drain.

According to an embodiment of the invention, the gates and the sources are symmetrically distributed relative to the drain as a circle center.

According to an embodiment of the invention, the gates and the sources are asymmetrically distributed relative to the drain as a circle center.

According to an embodiment of the invention, the semiconductor device further includes a plurality of channels respectively located in the first well and the second well below the first doped region and electrically connected to the source and the drain.

According to an embodiment of the invention, the semiconductor device further includes at least one body region having the first conductivity type located between two adjacent sources.

According to an embodiment of the invention, a doping concentration of the second well is less than a doping concentration of the first well.

According to an embodiment of the invention, a width of the second well is between 0.5 µm and 5 µm.

According to an embodiment of the invention, the first doped region includes a heavily doped region, a field region, a well, or a combination thereof.

According to an embodiment of the invention, the first doped region is not in direct contact with the substrate.

According to an embodiment of the invention, the semiconductor device further includes an isolation structure and a conductive structure. The isolation structure is located on the first well at the second side of the first doped region. The conductive structure is located on the first well and extends to cover a portion of the isolation structure.

According to an embodiment of the invention, the semiconductor device further includes a top doped region having the first conductivity type and a lightly doped region having the second conductivity type. The top doped region is located in the first well below the isolation structure. The lightly doped region is located between the isolation structure and the top doped region.

According to an embodiment of the invention, a shape of the semiconductor device includes a circular shape, an elliptical shape, and an octagonal shape, or a combination thereof.

The invention provides a method of manufacturing a semiconductor device including the following steps. A substrate having a first conductivity type is provided. A first well having a second conductivity type is foil red in the substrate. A first doped region having the first conductivity type is formed in the first well. A second well having the second conductivity type is formed in the first well, such that the second well is located between the first doped region and the substrate. At least one second doped region having the first conductivity type is formed in the first doped region. At least one third doped region having the second conductivity type is formed in the first well at a first side of the first doped region. A fourth doped region having the second conductivity type is formed in the first well at a second side of the first doped region.

According to an embodiment of the invention, the at least one second doped region includes a plurality of gates. The at least one third doped region includes a plurality of sources. The fourth doped region is a drain. The gates respectively correspond to the sources and surround the drain.

According to an embodiment of the invention, the method of manufacturing the semiconductor device further includes the following steps. A plurality of channels are formed in the first well and the second well below the first doped region. The channels are respectively electrically connected to the source and the drain. At least one body region is formed between two adjacent sources.

According to an embodiment of the invention, the step of forming the second well includes the following steps. A patterned mask is formed on the substrate. The patterned mask exposes a top surface of the first well. An ion implantation process is performed to form the first well in the substrate. The first well has a first portion and a second portion. The first portion and the second portion are separated by a distance. A thermal annealing process is performed to thermally diffuse ions implanted in the first portion and the second portion of the first well to a region between the first portion and the second portion, so as to form the second well.

According to an embodiment of the invention, a doping concentration of the second well is less than a doping concentration of the first well.

Based on the above, the fourth doped region (e.g., a drain) can be surrounded by the plurality of third doped regions (e.g., sources) or the plurality of second doped regions (e.g., gates) in the invention, such that the saturation current can be adjusted. Additionally, the pinch-off voltage can be changed by controlling the doping concentration or the width of the second well in the invention. Therefore, the saturation current and the pinch-off voltage can be adjusted to meet the customer-specific needs, while the size and breakdown voltage of the semiconductor device (e.g., the HV JFET) are maintained in the invention. Additionally, the need for adjusting the saturation current and the pinch-off voltage can be achieved in the case without changing any of processes and adding additional masks in the invention.

In order to make the aforementioned features and advantages of the disclosure more comprehensible, embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
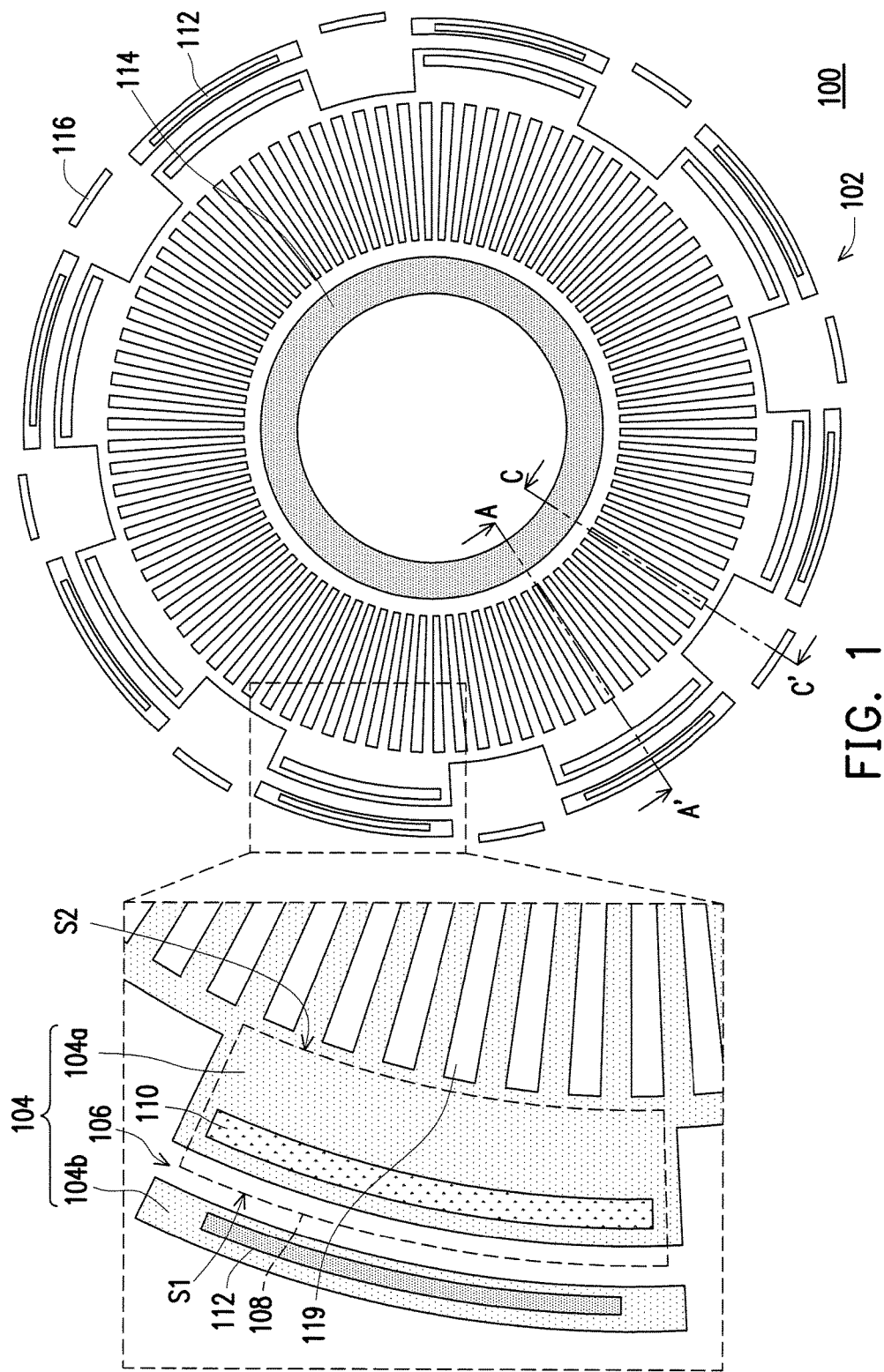
FIG. 1 is a schematic top view of a semiconductor device according to an embodiment of the invention.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

In the following embodiments, when a first conductivity type is N-type, a second conductivity type is P-type. When the first conductivity type is P-type, the second conductivity type is N-type. A P-type doping is boron, for example, and an N-type doping is phosphorus or arsenic, for example. In the embodiment, the first conductivity type being P-type and the second conductivity being N-type is taken as an example to illustrate. However, the invention is not limited thereto. Additionally, the same or similar reference numbers represent the same or similar components.

FIG. 1 is a schematic top view of a semiconductor device according to an embodiment of the invention.

Referring to FIG. 1, the embodiment provides a semiconductor device 100 including a substrate 102 having a first conductivity type, a first well 104 having a second conductivity type, a first doped region 108 having the first conductivity type, a second well 106 having the second conductivity type, a second doped region 110 having the first conductivity type, a third doped region 112 having the second conductivity type, a fourth doped region 114 having the second conductivity type, and a top doped region 119 having the first conductivity type. In an embodiment, the semiconductor device 100 may be a high-voltage junction field-effect transistor (HV JFET), for example, which can withstand a voltage of 100 V to 800 V and be used as a high-voltage start-up circuit. The semiconductor device 100 depicted in FIG. 1 is circular, but the invention is not limited thereto. In other embodiments, a shape of the semiconductor device 100 may be elliptical, octagonal, or a combination thereof.

In an embodiment, the substrate 102 may be, for example, a P-type semiconductor substrate, such as a P-type substrate. A material of the semiconductor substrate is selected from at least one of the group consisting of Si, Ge, SiGe, GaP, GaAs, SiC, SiGeC, InAs, and InP. The substrate 102 may also be an epitaxial layer (EPI), a non-epitaxial layer (non-EPI), a silicon-on insulator (SOI) substrate, or a combination thereof, for example.

The first well 104 is located in the substrate 102. As shown in an enlarged view of FIG. 1, the first well 104 may include a first portion 104a and a plurality of second portions 104b. A shape of the first portion 104a may be a gear-like shape, for example. Specifically, the first portion 104a has a plurality of protrusion portions. The protrusion portions are respectively disposed on a perimeter of a body region with circle. A shape of the second portion 104b may be an arc shape, for example. The second portions 104b respectively correspond to the protrusion portions of the first portion 104a. Each of the second portions 104b and a corresponding protrusion portion 104a of the first portion 104a are separated by a distance therebetween. In an embodiment, one second well 106 is sandwiched between each of the second portions 104b and the corresponding protrusion portion 104a of the first portion 104a.

The first doped region 108 is located in the first well 104. Specifically, a portion of the first doped region 108 and the first portion 104a of the first well 104 are overlapped, while another portion of the first doped region 108 and the second well 106 are overlapped. The first doped region 108 has a first side S1 (e.g., an outer side) and a second side S2 (e.g., an inner side) opposite to each other.

The second well 106 is located between the first portion 104a and the second portion 104b of the first well 104. The second doped region 110 is located in the first doped region 108. In an embodiment, the first doped region 108 completely covers the second doped region 110. The third doped region 112 is located in the second portion 104b of the first well 104 at the first side S1 of the first doped region 108. In an embodiment, the second portion 104b of the first well 104 completely covers the third doped region 112. The fourth doped region 114 is located in the first portion 104a of the first well 104 at the second side S2 of the first doped region 108. In an embodiment, the first portion 104a of the first well 104 completely covers the fourth doped region 114.

The top doped region 119 is located in the first portion 104a of the first well 104. In an embodiment, the top doped region 119 may be a plurality of stripe-shaped doped regions, for example. The plurality of stripe-shaped doped regions are radially distributed outwardly from the fourth doped region 114 as a center and surround the fourth doped region 114. The stripe-shaped doped regions may have the same or different pitches.

In an embodiment, the second doped region 110 may be one doped region or a plurality of doped regions, for example. The third doped region 112 may be one doped region or a plurality of doped regions, for example. The semiconductor device 100 further includes a body region 116 having the first conductivity type located between two adjacent second doped regions 110 (or the third doped regions 112). When the second doped region 110 and the third doped region 112 are a plurality of doped regions as shown in FIG. 1, for example, the second doped regions 110 (e.g., gate) respectively correspond to the third doped regions 112 (e.g., source), and both the second doped regions 110 and the third doped regions 112 surround the fourth doped region 114 (e.g., drain). In an embodiment, the second doped regions 110 and the third doped regions 112 are symmetrically distributed relative to the fourth doped region 114 as a circle center. However, the invention is not limited thereto. In other embodiments, the second doped regions 110 and the third doped regions 112 may also be asymmetrically distributed relative to the fourth doped region 114 as a circle center (as shown in FIG. 3E).

Although eight second doped regions 110, eight third doped regions 112, and eight body regions 116 are depicted in FIG. 1, the invention is not limited thereto. In other embodiments, the numbers of the second doped region 110, the third doped region 112, and the body region 116 may be adjusted according to the needs (as shown in FIG. 3A to FIG. 3D). It should be mentioned that the saturation current can be adjusted by changing the numbers of the second doped region 110 and the third doped regions 112 of the embodiment, so as to meet the customer-specific needs. For instance, when the numbers of the second doped region 110 and the third doped regions 112 increase, the area of the third doped region 112 corresponding to the fourth doped region 114 also increases, which makes the drain current or the saturation current of the semiconductor device 100 increase. On the contrary, when the paths or channels from the fourth doped region 114 to the third doped region 112 decrease, the drain current or the saturation current of the semiconductor device 100 also decreases. Therefore, the drain current or the saturation current of the semiconductor device 100 can be adjusted or changed to meet the different needs of the customers in the case where the size or breakdown voltage of the semiconductor device 100 is maintained in the embodiment.

Figure 2A:
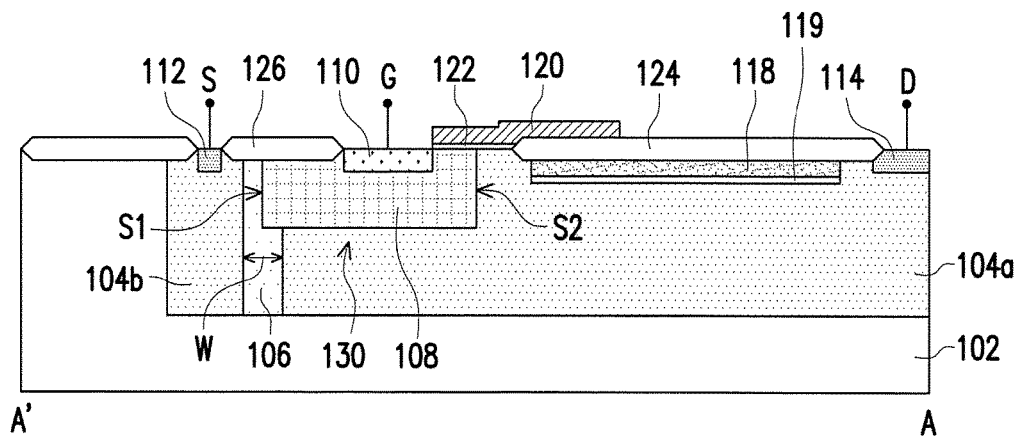
FIG. 2A is a schematic cross-sectional view taken along a line A-A' of FIG. 1.
Figure 2B:
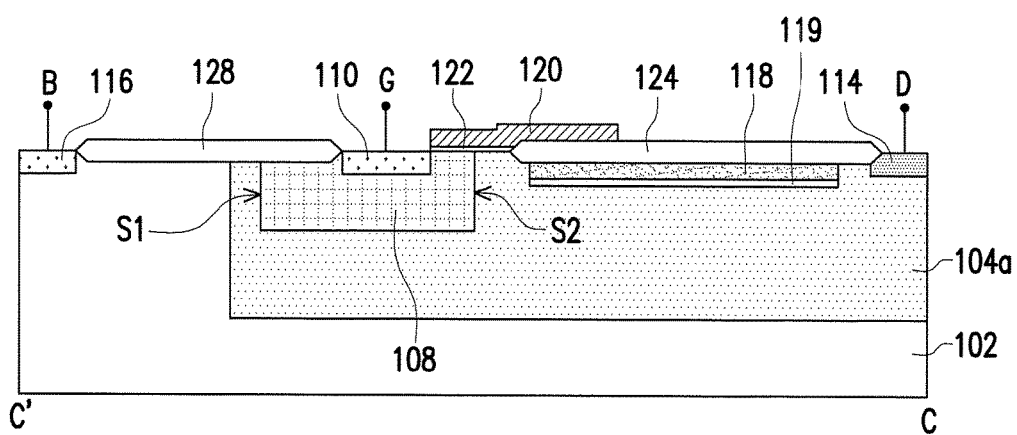
FIG. 2B is a schematic cross-sectional view taken along a line C-C' of FIG. 1.

FIG. 2A is a schematic cross-sectional view taken along a line A-A' of FIG. 1. FIG. 2B is a schematic cross-sectional view taken along a line C-C' of FIG. 1.

Referring to FIG. 1, FIG. 2A, and FIG. 2B, the semiconductor device 100 of the embodiment further includes a channel 130 located in the first well 104 and the second well 106 below the first doped region 108. Particularly, the channel 130 may be extended along a bottom surface of the first doped region 108. As shown in FIG. 2A, the first well 104, the second well 106, and the channel 130 are located between the first doped region 108 and the substrate 102, such that the first doped region 108 is not in direct contact with the substrate 102. When the high-voltage start-up circuit is turned on, the channel 130 may allow the drain current to flow from the fourth doped region 114 (e.g., drain D) to the third doped region 112 (e.g., source S). In other words, the channel 130 may be electrically connected to the source S and the drain D. On the other hand, a gate voltage may be applied to the second doped region 110 (e.g., gate G), and a body voltage may be applied to the body region 116 (e.g., body B), such that a pinch-off channel (not shown) is generated in the second well 106 between the first doped region 108 and the substrate 102 to pinch off the channel 130, thereby turning off the high-voltage start-up circuit. In an embodiment, the pinch-off channel in the second well 106 may be extended from the first doped region 108 to the substrate 102.

It should be mentioned that a doping concentration of the second well 106 may be less than a doping concentration of the first well 104. Thus, when the high-voltage start-up circuit is turned off, the pinch-off channel is easily generated in the second well 106. Additionally, a pinch-off voltage can be changed by controlling the doping concentration or a width W of the second well 106 in the embodiment. For instance, when the doping concentration of the second well 106 is larger or the width W thereof is wider, the pinch-off voltage thereof is larger. On the contrary, when the doping concentration of the second well 106 is smaller or the width W thereof is narrower, the pinch-off voltage thereof is smaller. Therefore, the pinch-off voltage of the semiconductor device 100 can be adjusted or changed to meet the different needs of the customers in the case without changing any of process conditions and adding additional masks in the embodiment.

In an embodiment, a method of forming the second well 106 may include disposing a patterned mask (not shown) on the substrate 102 during forming the first well 104. The patterned mask exposes a top surface of the first well 104. Thereafter, an ion implantation process is performed to form the first well 104 in the substrate 102. At this time, the first portion 104a and the second portion 104b of the first well 104 are separated by a distance. In an embodiment, the distance may be the width W of the second well 106, for example. The width W may be between 0.5 μm and 5 μm. Then, a thermal annealing process is performed to thermally diffuse ions implanted in the first portion 104a and the second portion 104b of the first well 104 to the region of the second well 106. In an alternative embodiment, the second well 106 having a lighter doping concentration may be formed by a lithography and ion implantation process, wherein the second well 106 is located between the first portion 104a and the second portion 104b of the first well 104.

In an embodiment, the first well 104 includes an epitaxial layer or a non-epitaxial layer. The non-epitaxial layer may be a well, a drift layer, a buffer layer, a deep well, a doped layer, or a combination thereof, for example. In the embodiment, the first well 104 may be an N-type deep well. An implanted dopant may be phosphorus or arsenic, for example. A doping concentration may be $1\times10^{13}/cm^3$ to $5\times10^{15}/cm^3$, for example. A doping concentration of the second well 106 may be $1\times10^{13}/cm^3$ to $5\times10^{15}/cm^3$, for example.

In an embodiment, the first doped region 108 may be a heavily doped region, a field region, a well, or a combination thereof, for example. A method of forming the first doped region 108 may be a lithography and ion implantation process, for example. An implanted dopant may be boron, for example. A doping concentration may be $1\times10^{15}/cm^3$ to $5\times10^{17}/cm^3$, for example.

Additionally, the semiconductor device 100 of the embodiment further includes isolation structures 124, 126, and 128, a conductive structure 120, a top doped region 119 having the first conductivity type, and a lightly doped region 118 having the second conductivity type. As shown in FIG. 2A, the isolation structure 124 is located on the first portion 104a of the first well 104 at the second side S2 of the first doped region 108. The isolation structure 126 is located on the substrate 102 between the second doped region 110 and the third doped region 112. As shown in FIG. 2B, the isolation structure 128 is located on the substrate 102 between the second doped region 110 and the body region 116. A material of the isolation structures 124, 126, and 128 is doped or non-doped silicon oxide, low stress silicon nitride, silicon oxynitride, or a combination thereof, for example, and a forming method thereof may be local oxidation of silicon (LOCOS), shallow trench isolation, or deep trench isolation, for example. In an embodiment, the isolation structures 124, 126, and 128 may be field oxide (FOX), shallow trench isolation, and deep trench isolation, or a combination thereof.

The conductive structure 120 is located on the first portion 104a of the first well 104 and extended to cover a portion of the isolation structure 124. Specifically, the conductive structure 120 and the first portion 104a of the first well 104, and the conductive structure 120 and the first doped region 108 have a dielectric layer 122 therebetween. In an embodiment, the conductive structure 120 may be used as a field plate. The field plate may homogenize the electric field distribution in the semiconductor device 100 to improve the breakdown voltage of the semiconductor device 100. In an embodiment, a material of the conductive structure 120 includes polycrystalline silicon. A method of foil ling the conductive structure 120 may be a chemical vapor deposition method. A material of the dielectric layer 122 includes silicon oxide, and a forming method thereof may be a chemical vapor deposition method.

The top doped region 119 is located in the first portion 104a of the first well 104 below the isolation structure 124. The top doped region 119 has a reduced surface field (RESURF) effect, thereby improving the breakdown voltage of the semiconductor device 100. In an embodiment, an implanted dopant in the top doped region 119 may be boron, for example, and a doping concentration thereof may be $1\times10^{16}/cm^3$ to $5\times10^{17}/cm^3$, for example. The lightly doped region 118 is located between the isolation structure 124 and the top doped region 119. The lightly doped region 118 may be used as another current channel to reduce an on-resistance of the semiconductor device 100. In an embodiment, an implanted dopant in the lightly doped region 118 may be phosphorus or arsenic, for example, and a doping concentration thereof may be $1\times10^{16}/cm^3$ to $5\times10^{17}/cm^3$, for example. In an embodiment, the top doped region 119 and the lightly doped region 118 may be selectively formed. In other words, the semiconductor device without the top doped region 119 and the lightly doped region 118 or the semiconductor device with one of the top doped region 119 and the lightly doped region 118 is also within the scope of the invention.

In an embodiment, a method of forming the second doped region 110, the third doped region 112, the fourth doped region 114, and the body region 116 may be a lithography and ion implantation process, for example. An implanted dopant in the second doped region 110 and the body region 116 may be boron, for example. A doping concentration of the second doped region 110 may be $1\times10^{18}/cm^3$ to $5\times10^{19}/cm^3$, for example. A doping concentration of the body region 116 may be $1\times10^{18}/cm^3$ to $5\times10^{19}/cm^3$, for example. An implanted dopant in the third doped region 112 and the fourth doped region 114 may be phosphorus or arsenic, for example. A doping concentration of the third doped region 112 may be $1\times10^{18}/cm^3$ to $5\times10^{19}/cm^3$, for example. A doping concentration of the fourth doped region 114 may be $1\times10^{18}/cm^3$ to $5\times10^{19}/cm^3$, for example.

In an alternative embodiment, when the conductive structure 120 is formed, another conductive structure (not shown) may be formed to cover the region other than the third doped region 112 (e.g., cover the region of the body region 116) at the same time. In other words, a top surface of the third doped region 112 is exposed by the conductive structure. Thus, the conductive structure may be used as a mask to perform an ion implantation process of the third doped region 112.

The third doped region 112 and the body region 116 in different numbers and different configurations are illustrated below.

Figure 3A:
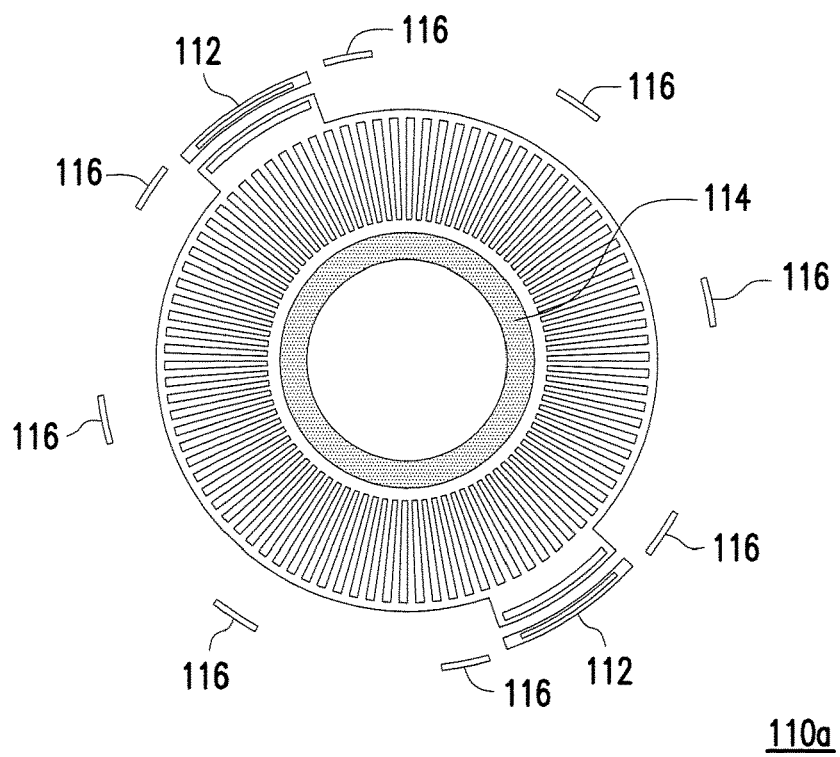
FIG. 3A is a schematic top view of a semiconductor device according to a first embodiment of the invention.
Figure 3B:
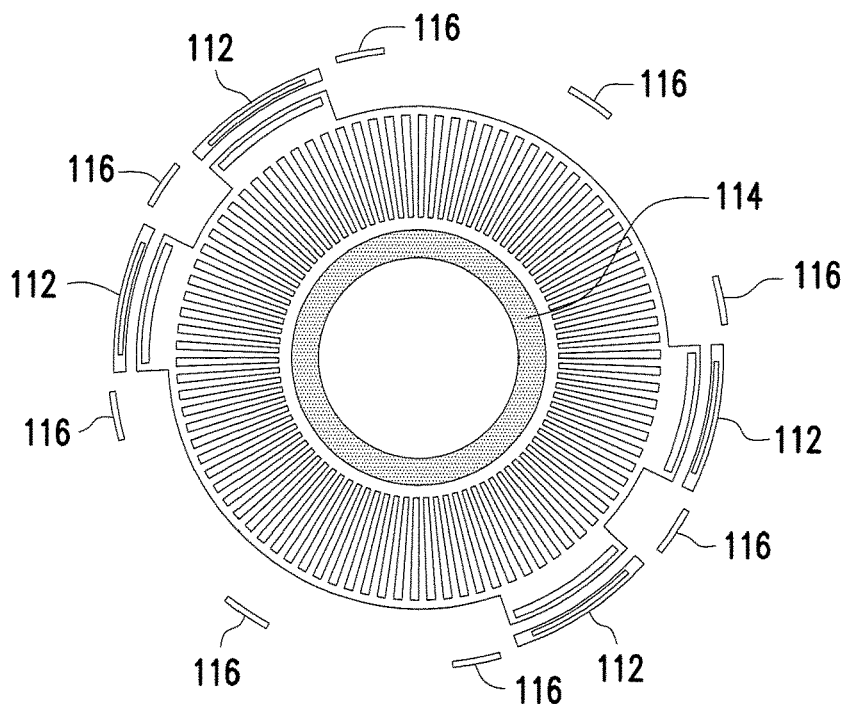
FIG. 3B is a schematic top view of a semiconductor device according to a second embodiment of the invention.
Figure 3C:
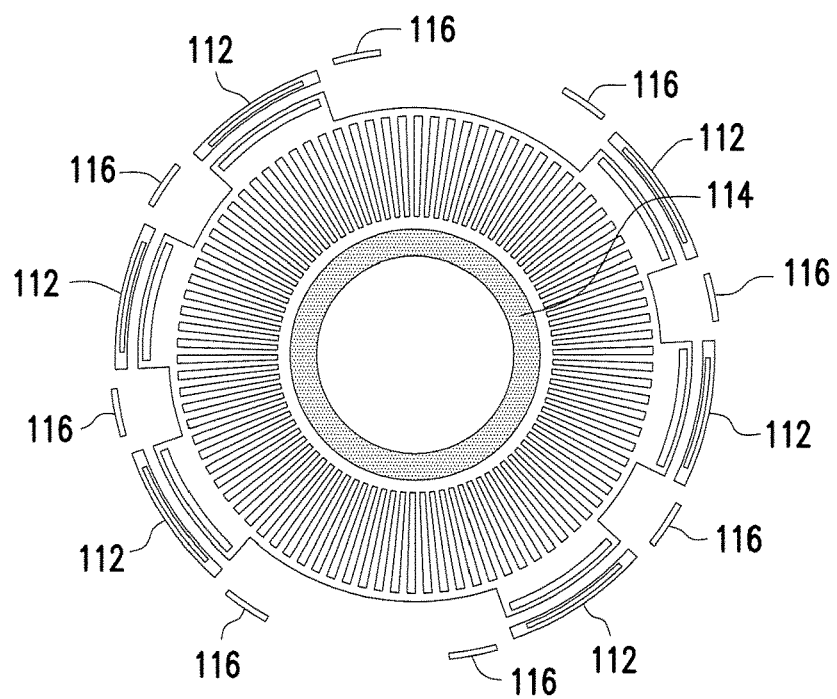
FIG. 3C is a schematic top view of a semiconductor device according to a third embodiment of the invention.
Figure 3D:
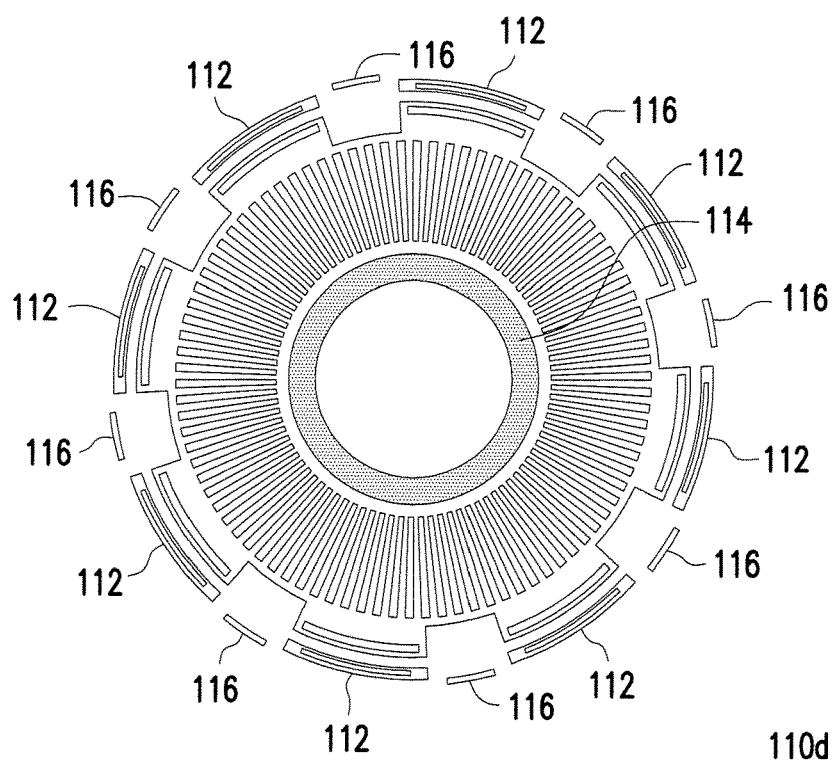
FIG. 3D is a schematic top view of a semiconductor device according to a fourth embodiment of the invention.
Figure 3E:
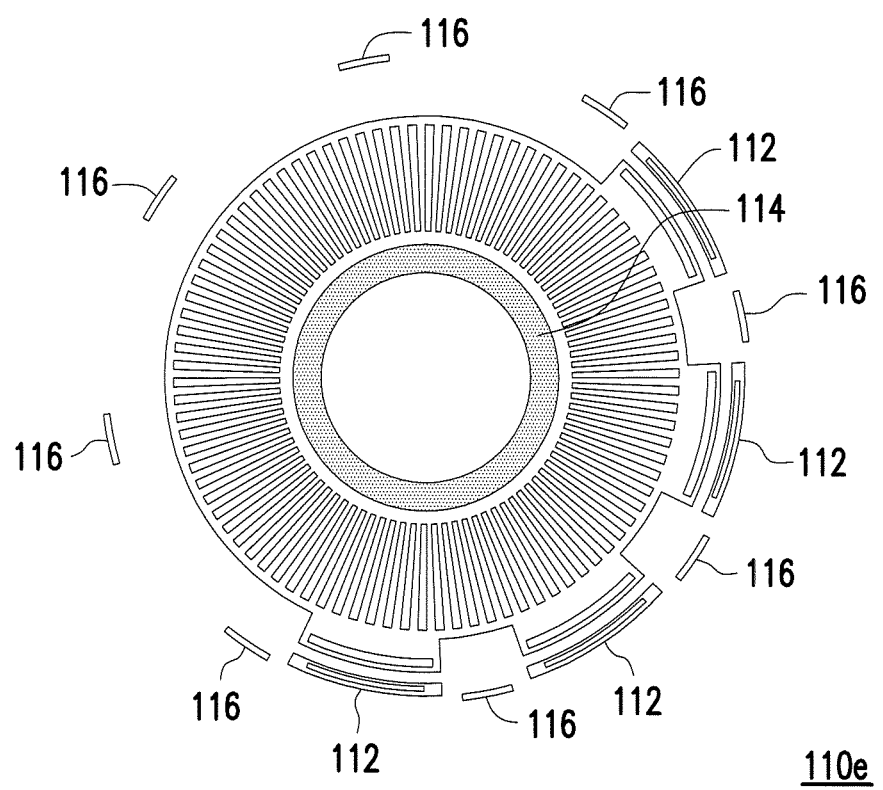
FIG. 3E is a schematic top view of a semiconductor device according to a fifth embodiment of the invention.

FIG. 3A is a schematic top view of a semiconductor device according to a first embodiment of the invention. FIG. 3B is a schematic top view of a semiconductor device according to a second embodiment of the invention. FIG. 3C is a schematic top view of a semiconductor device according to a third embodiment of the invention. FIG. 3D is a schematic top view of a semiconductor device according to a fourth embodiment of the invention. FIG. 3E is a schematic top view of a semiconductor device according to a fifth embodiment of the invention. For clarity, FIG. 3A to FIG. 3E only show the third doped region 112, the fourth doped region 114, and the body region 116. Other components are similar to FIG. 1, and are not repeated again.

Referring to FIG. 3A, a semiconductor device 100a of the first embodiment has two third doped regions 112 and eight body regions 116. The two third doped regions 112 are symmetrically distributed relative to the fourth doped region 114 as a circle center. The eight body regions 116 are uniformly distributed between the two third doped regions 112. Particularly, the semiconductor device 100a of the first embodiment has two channels, which are respectively extended from the two third doped regions 112 (e.g., the source) to the fourth doped region 114 (e.g., the drain).

Referring to FIG. 3B, a semiconductor device 100b of the second embodiment is similar to the semiconductor device 100a of the first embodiment. The difference between the two is that the semiconductor device 100b of the second embodiment has four third doped regions 112. The four third doped regions 112 are symmetrically distributed relative to the fourth doped region 114 as a circle center. Particularly, the semiconductor device 100b of the second embodiment has four channels, which are respectively extended from the four third doped regions 112 (e.g., the source) to the fourth doped region 114 (e.g., the drain).

Referring to FIG. 3C, a semiconductor device 100c of the third embodiment is similar to the semiconductor device 100a of the first embodiment. The difference between the two is that the semiconductor device 100c of the third embodiment has six third doped regions 112. The six third doped regions 112 are symmetrically distributed relative to the fourth doped region 114 as a circle center. Particularly, the semiconductor device 100c of the third embodiment has six channels, which are respectively extended from the six third doped regions 112 (e.g., the source) to the fourth doped region 114 (e.g., the drain).

Referring to FIG. 3D, a semiconductor device 100d of the fourth embodiment is similar to the semiconductor device 100a of the first embodiment. The difference between the two is that the semiconductor device 100d of the fourth embodiment has eight third doped regions 112. The eight third doped regions 112 are symmetrically distributed relative to the fourth doped region 114 as a circle center. Particularly, the semiconductor device 100d of the fourth embodiment has eight channels, which are respectively extended from the eight third doped regions 112 (e.g., the source) to the fourth doped region 114 (e.g., the drain).

Referring to FIG. 3E, a semiconductor device 100e of the fifth embodiment is similar to the semiconductor device 100b of the second embodiment. The difference between the two is that the four third doped regions 112 of the semiconductor device 100e of the fifth embodiment are asymmetrically distributed relative to the fourth doped region 114 as a circle center. The semiconductor device 100e of the fifth embodiment still has four channels, which are respectively extended from the four third doped regions 112 (e.g., the source) to the fourth doped region 114 (e.g., the drain).

In summary, the fourth doped region (e.g., a drain) can be surrounded by the plurality of third doped regions (e.g., sources) or the plurality of second doped regions (e.g., gates) in the invention, such that the drain current or the saturation current can be adjusted. Additionally, the pinch-off voltage can be changed by controlling the doping concentration or the width of the second well in the invention. Therefore, the saturation current and the pinch-off voltage can be adjusted to meet the customer-specific needs, while the size and the breakdown voltage of the semiconductor device (e.g., the HV JFET) are maintained in the invention. Additionally, the need for adjusting the saturation current and the pinch-off voltage can be achieved in the case without changing any of processes and adding additional masks in the invention.

Although the invention has been described with reference to the above embodiments, it will be apparent to one of ordinary skill in the art that modifications to the described embodiments may be made without departing from the spirit of the invention. Accordingly, the scope of the invention is defined by the attached claims not by the above detailed descriptions.

What is claimed is:

1. A semiconductor device, comprising:
   a substrate having a first conductivity type;
   a first well having a second conductivity type, located in the substrate;
   a first doped region having the first conductivity type, located in the first well;
   a second well having the second conductivity type, located in the first well and between the first doped region and the substrate;
   at least one second doped region having the first conductivity type, located in the first doped region;
   at least one third doped region having the second conductivity type, located in the first well at a first side of the first doped region; and
   a fourth doped region having the second conductivity type, located in the first well at a second side of the first doped region,
   wherein the at least one second doped region is a gate, the at least one third doped region is a source, the fourth doped region is a drain, and the gate and the source surround the drain.

2. The semiconductor device according to claim 1, further comprising at least one channel located in the first well and the second well below the first doped region and electrically connected to the source and the drain.

3. The semiconductor device according to claim 1, wherein the at least one second doped region comprises a plurality of gates, the at least one third doped region comprises a plurality of sources, the fourth doped region is a drain, and the gates respectively correspond to the sources and surround the drain.

4. The semiconductor device according to claim 3, wherein the gates and the sources are symmetrically distributed relative to the drain as a circle center.

5. The semiconductor device according to claim 3, wherein the gates and the sources are asymmetrically distributed relative to the drain as a circle center.

6. The semiconductor device according to claim 3, further comprising a plurality of channels respectively located in the first well and the second well below the first doped region and electrically connected to the sources and the drain.

7. The semiconductor device according to claim 3, further comprising at least one body region having the first conductivity type located between two adjacent sources.

8. The semiconductor device according to claim 1, wherein a doping concentration of the second well is less than a doping concentration of the first well.

9. The semiconductor device according to claim 1, wherein a width of the second well is between 0.5 μm and 5 μm.

10. The semiconductor device according to claim 1, wherein the first doped region comprises a heavily doped region, a field region, a well, or a combination thereof.

11. The semiconductor device according to claim 1, wherein the first doped region is not in direct contact with the substrate.

12. The semiconductor device according to claim 1, further comprising:
   an isolation structure, located on the first well at the second side of the first doped region; and
   a conductive structure, located on the first well and extending to cover a portion of the isolation structure.

13. The semiconductor device according to claim 12, further comprising:
- a top doped region having the first conductivity type located in the first well below the isolation structure; and
- a lightly doped region having the second conductivity type located between the isolation structure and the top doped region.

14. The semiconductor device according to claim 1, wherein a shape of the semiconductor device comprises a circular shape, an elliptical shape, and an octagonal shape, or a combination thereof.

15. A method of manufacturing a semiconductor device, comprising:
- providing a substrate having a first conductivity type;
- forming a first well having a second conductivity type in the substrate;
- forming a first doped region having the first conductivity type in the first well;
- forming a second well having the second conductivity type in the first well, such that the second well is located between the first doped region and the substrate;
- forming at least one second doped region having the first conductivity type in the first doped region;
- forming at least one third doped region having the second conductivity type in the first well at a first side of the first doped region; and
- forming a fourth doped region having the second conductivity type in the first well at a second side of the first doped region, wherein the at least one second doped region comprises a plurality of gates, the at least one third doped region comprises a plurality of sources, the fourth doped region is a drain, and the gates respectively correspond to the sources and surround the drain.

16. The method of manufacturing the semiconductor device according to claim 15, further comprising:
- forming a plurality of channels in the first well and the second well below the first doped region, wherein the channels are respectively electrically connected to the sources and the drain; and
- forming at least one body region between two adjacent sources.

17. The method of manufacturing the semiconductor device according to claim 15, wherein the step of forming the second well comprises:
- forming a patterned mask on the substrate, the patterned mask exposing a top surface of the first well;
- performing an ion implantation process to form the first well in the substrate, wherein the first well has a first portion and a second portion, and the first portion and the second portion are separated by a distance; and
- performing a thermal annealing process to thermally diffuse ions implanted in the first portion and the second portion of the first well to a region between the first portion and the second portion, so as to form the second well.

18. The method of manufacturing the semiconductor device according to claim 15, wherein a doping concentration of the second well is less than a doping concentration of the first well.

* * * * *